United States Patent
Yamazaki

(10) Patent No.: US 9,443,893 B2
(45) Date of Patent: Sep. 13, 2016

(54) SEMICONDUCTOR DEVICE AND METHOD OF MANUFACTURING THE SAME

(71) Applicant: SEMICONDUCTOR ENERGY LABORATORY CO., LTD., Atsugi-shi, Kanagawa-ken (JP)

(72) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/987,796

(22) Filed: Jan. 5, 2016

(65) Prior Publication Data

US 2016/0118423 A1    Apr. 28, 2016

Related U.S. Application Data

(63) Continuation of application No. 13/864,465, filed on Apr. 17, 2013, now Pat. No. 9,236,408.

(30) Foreign Application Priority Data

Apr. 25, 2012  (JP) .................................. 2012-100494

(51) Int. Cl.
*H01L 31/062* (2012.01)
*H01L 27/146* (2006.01)
(Continued)

(52) U.S. Cl.
CPC ... *H01L 27/14612* (2013.01); *H01L 27/14603* (2013.01); *H01L 27/14609* (2013.01);
(Continued)

(58) Field of Classification Search
CPC ................. H01L 27/14603; H01L 27/14609; H01L 27/14612; H01L 27/14692

USPC .............. 257/292, 225, 223, E27.13; 438/79
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

(Continued)

*Primary Examiner* — Matthew Gordon
(74) *Attorney, Agent, or Firm* — Nixon Peabody LLP; Jeffrey L. Costellia

(57) ABSTRACT

A solid-state image sensing element including a transistor with stable electrical characteristics (e.g., significantly low off-state current) is provided. Two different element layers (an element layer including an oxide semiconductor layer and an element layer including a photodiode) are stacked over a semiconductor substrate provided with a driver circuit such as an amplifier circuit, so that the area occupied by a photodiode is secured. A transistor including an oxide semiconductor layer in a channel formation region is used as a transistor electrically connected to the photodiode, which leads to lower power consumption of a semiconductor device.

19 Claims, 8 Drawing Sheets

(51) Int. Cl.
*H01L 29/16* (2006.01)
*H01L 29/24* (2006.01)
*H01L 29/786* (2006.01)
*H01L 31/028* (2006.01)
*H01L 31/105* (2006.01)

(52) U.S. Cl.
CPC ... *H01L27/14636* (2013.01); *H01L 27/14643* (2013.01); *H01L 29/16* (2013.01); *H01L 29/24* (2013.01); *H01L 29/7869* (2013.01); *H01L 31/028* (2013.01); *H01L 31/105* (2013.01); H01L 27/14692 (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,378,391 B2 | 2/2013 | Koyama et al. |
| 8,716,712 B2 | 5/2014 | Kozuma et al. |
| 8,916,869 B2 | 12/2014 | Koyama et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0145217 A1 | 7/2006 | Sohn |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0054319 A1 | 3/2008 | Mouli |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0065823 A1 | 3/2009 | Hwang |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0134735 A1 | 6/2010 | Nakamura et al. |
| 2011/0108706 A1 | 5/2011 | Koyama |
| 2011/0108836 A1 | 5/2011 | Koyama et al. |
| 2011/0109592 A1 | 5/2011 | Kurokawa et al. |
| 2011/0127534 A1 | 6/2011 | Weisfield |
| 2011/0175895 A1 | 7/2011 | Hayakawa et al. |
| 2011/0176038 A1 | 7/2011 | Kurokawa et al. |
| 2011/0198483 A1 | 8/2011 | Kurokawa |
| 2011/0205412 A1 | 8/2011 | Miyazaki et al. |
| 2011/0221723 A1 | 9/2011 | Kurokawa et al. |
| 2012/0154337 A1 | 6/2012 | Kurokawa et al. |
| 2012/0162167 A1 | 6/2012 | Kurokawa |
| 2014/0042434 A1 | 2/2014 | Yamazaki |
| 2014/0225107 A1 | 8/2014 | Kozuma et al. |
| 2014/0264518 A1 | 9/2014 | Matsuzaki |
| 2014/0293711 A1 | 10/2014 | Kato et al. |
| 2015/0048366 A1 | 2/2015 | Koyama et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |

(56) References Cited

FOREIGN PATENT DOCUMENTS

| JP | 2004-273732 A | 9/2004 |
| JP | 2010-153834 A | 7/2010 |
| JP | 2011-119711 A | 6/2011 |
| JP | 2011-119950 A | 6/2011 |
| JP | 2011-192976 A | 9/2011 |
| WO | WO-2004/114391 | 12/2004 |
| WO | WO-2011/055626 | 5/2011 |
| WO | WO-2011/102183 | 8/2011 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Lee.M et al., "15.4:Excellent Performance of Indium—Oxide—Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

(56) References Cited

OTHER PUBLICATIONS

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 38, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW'08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

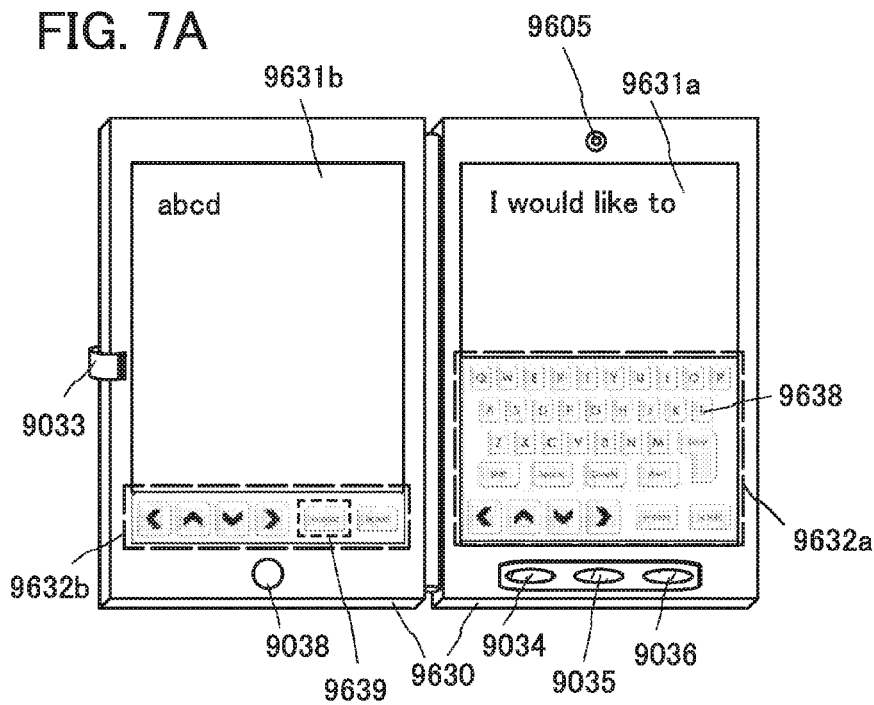
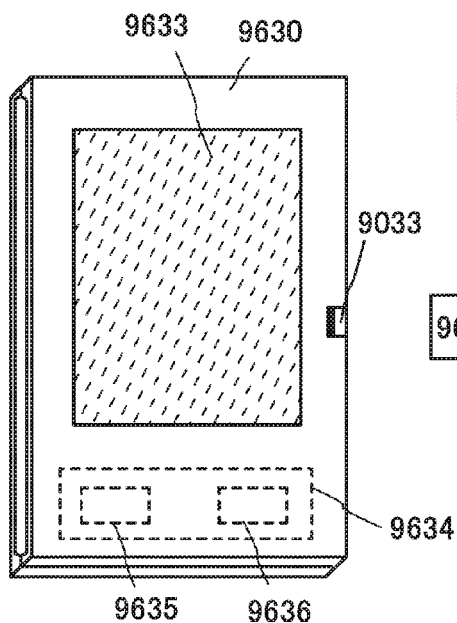
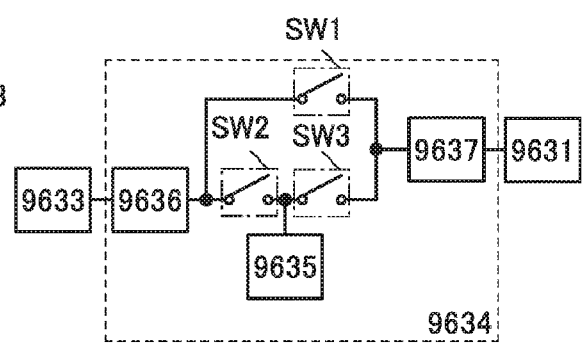

SEMICONDUCTOR DEVICE AND METHOD OF MANUFACTURING THE SAME

BACKGROUND OF THE INVENTION

1. Field of the Invention

The present invention relates to a semiconductor device including an oxide semiconductor and a manufacturing method thereof.

In this specification, a semiconductor device generally means a device which can function by utilizing semiconductor characteristics, and an electrooptic device, a semiconductor circuit, and an electronic device are all semiconductor devices.

2. Description of the Related Art

Solid-state image sensing devices are broadly classified into charge-transfer-type solid-state image sensing devices typified by CCD image sensors and amplification type solid-state image sensing devices typified by CMOS image sensors.

A two-dimensional solid-state image sensing device in which pixels each including a photoelectric conversion element such as a photodiode and a means for extracting photocharge generated in the photoelectric conversion element to an output signal line are arranged in a matrix has been widely used. For example, a two-dimensional solid-state image sensing device is mounted on a camera-equipped mobile phone or a portable information terminal such as a PDA.

A technique for manufacturing a transistor or the like by using an oxide semiconductor layer for a channel formation region and applying it has been attracting attention. Examples of such a transistor include a transistor including zinc oxide (ZnO) in an oxide semiconductor layer and a transistor including $InGaO_3(ZnO)_m$ in an oxide semiconductor layer.

Patent Document 1 discloses a structure in which a pixel in a display device is provided with two different elements, i.e., a transistor including an oxide semiconductor layer and a photodiode including amorphous silicon in a photoelectric conversion layer.

REFERENCE

Patent Document 1: Japanese Published Patent Application No. 2010-153834

SUMMARY OF THE INVENTION

As a pixel is more miniaturized, it is more difficult to secure the area occupied by a photodiode. Since a transistor is also formed in a pixel, as the area occupied by the transistor increases, the percentage of the area occupied by a photodiode in the entire area of the region where the elements can be integrated decreases.

One embodiment of the present invention provides a semiconductor device including a solid-state image sensing device in which the amount of saturation charge can be sufficiently held in a pixel even when the pixel is miniaturized, and also provides a method of manufacturing the semiconductor device.

A transistor including single crystal silicon in a channel formation region cannot be said to have ideal electrical characteristics. For example, off-state current (also referred to as leakage current or the like) is not low enough to be regarded as substantially zero. Hence, to form a charge retention semiconductor device such as a solid-state image sensing element, a device capable of holding a potential for a long time and having lower off-state current has been expected to be developed.

In view of the above, an object of one embodiment of the disclosed invention is to provide a solid-state image sensing element including a transistor with stable electrical characteristics (e.g., significantly low off-state current).

Two different element layers (an element layer including an oxide semiconductor layer and an element layer including a photodiode) are stacked over a semiconductor substrate provided with a driver circuit such as an amplifier circuit, so that the area occupied by a photodiode is secured. In addition, a transistor including an oxide semiconductor layer in a channel formation region is used as a transistor electrically connected to the photodiode, which leads to lower power consumption of the semiconductor device.

One embodiment of the invention disclosed in this specification is a semiconductor device including a driver circuit including a first transistor on a semiconductor substrate, a second transistor including an oxide semiconductor layer in a channel formation region over the semiconductor substrate, and a photodiode located over the semiconductor substrate and electrically connected to the second transistor, in which the photodiode partly overlaps the second transistor.

In an example of a method of manufacturing the above structure, after an amplifier circuit or the like is formed on the semiconductor substrate, the transistor including an oxide semiconductor layer in a channel formation region is formed, and a crystalline silicon layer separated from another semiconductor substrate is bonded onto the transistor to form the photodiode including the crystalline silicon layer in a photoelectric conversion layer, so that a semiconductor device in which the element layer including the photodiode is stacked over the element layer including an oxide semiconductor layer is manufactured.

The element layer including an oxide semiconductor layer has a light-transmitting property and therefore a structure in which the order of stacking the two different element layers is reversed is also possible. An embodiment in that case is a semiconductor device including a driver circuit including a first transistor on a semiconductor substrate, a second transistor including an oxide semiconductor layer in a channel formation region over the semiconductor substrate, and a photodiode located over the semiconductor substrate and electrically connected to the second transistor, in which the second transistor partly overlaps the photodiode.

In an example of a method of manufacturing the above structure, after an amplifier circuit or the like is formed on the semiconductor substrate, a crystalline silicon layer separated from another semiconductor substrate is bonded to form the photodiode including the crystalline silicon layer in a photoelectric conversion layer, and the transistor including an oxide semiconductor layer in a channel formation region is formed over the photodiode, so that the element layer including an oxide semiconductor layer is stacked over the element layer including the photodiode is manufactured.

Three different elements may overlap each other. An embodiment in that case is a semiconductor device including a driver circuit including a first transistor on a semiconductor substrate, a second transistor including an oxide semiconductor layer in a channel formation region over the semiconductor substrate, and a photodiode located over the semiconductor substrate and electrically connected to the second transistor, in which the first transistor, the second transistor, and the photodiode partly overlap each other.

With the three different elements overlapping each other, higher integration can be achieved.

A reset transistor electrically connected to a transistor electrically connected to the photodiode may be provided. An embodiment in that case is a semiconductor device including a driver circuit including a first transistor on a semiconductor substrate, a second transistor and a third transistor each including an oxide semiconductor layer in a channel formation region over the semiconductor substrate, and a photodiode located over the semiconductor substrate and electrically connected to one of terminals of the second transistor, in which the other of the terminals of the second transistor is electrically connected to the third transistor and to a gate electrode layer of the first transistor, and the photodiode partly overlaps the second transistor or the third transistor.

In any of the above structures, a channel formation region of the first transistor includes crystalline silicon.

In any of the above structures, a semiconductor layer of the photodiode includes crystalline silicon.

In any of the above structures, the photodiode includes a p-type semiconductor region, an i-type semiconductor region, and an n-type semiconductor region. A typical photodiode is a pin-type photodiode, and a pn-type photodiode and a Schottky photodiode can also be given; any one of the photodiodes can be used as appropriate.

The two different element layers (the element layer including an oxide semiconductor layer and the element layer including a photodiode) are stacked over a semiconductor substrate provided with a driver circuit such as an amplifier circuit, so that higher integration can be achieved. In addition, the photodiode is of a surface incident type and only the diode is provided over the surface, so that the sufficient area occupied by the photodiode can be secured and an area for light reception can be increased. Accordingly, the amount of saturation signal charge in a pixel can be increased and dynamic range can be increased. Alternatively, since the element layer including an oxide semiconductor layer has a light-transmitting property, a structure in which the order of stacking the two different element layers is reversed is also possible.

In addition, by using the transistor including an oxide semiconductor layer in a channel formation region as the transistor electrically connected to the photodiode, a semiconductor device having low power consumption can be fabricated.

BRIEF DESCRIPTION OF THE DRAWINGS

In the accompanying drawings:

FIGS. 7A to 7C illustrate an electronic device; and

DETAILED DESCRIPTION OF THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

Figure 1A:
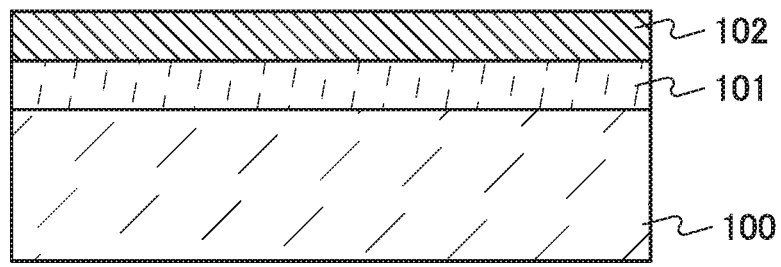
FIGS. 1A and 1B are each a conceptual diagram of a structure illustrating one embodiment of the present invention.
Figure 1B:
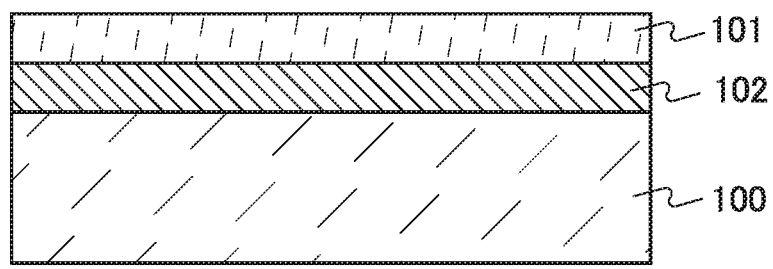

An example of a structure of a solid-state image sensing device is described using FIGS. 1A and 1B.

FIG. 1A is a schematic cross-sectional view of a stacked layer structure in which an element layer 101 including an oxide semiconductor layer is provided over a semiconductor substrate 100 provided with a driver circuit such as an amplifier circuit and an element layer 102 including a photodiode is provided over the element layer 101 including an oxide semiconductor layer.

As the semiconductor substrate 100, a single crystal semiconductor substrate or a polycrystalline semiconductor substrate made of silicon or silicon carbide, a compound semiconductor substrate made of silicon germanium or the like, an SOI substrate, or the like can be used. A channel formation region of a transistor can be formed in or over the semiconductor substrate. A transistor including a material such as silicon can easily perform high-speed operation, and an n-channel transistor, a p-channel transistor, or the like is employed to fabricate the semiconductor substrate 100 provided with a driver circuit such as an amplifier circuit.

The element layer 101 including an oxide semiconductor layer is a layer including at least one transistor including an oxide semiconductor layer in a channel formation region. For the oxide semiconductor layer, any of the following can be used: a two-component metal oxide such as an In—Zn-based oxide, an In—Mg-based oxide, or an In—Ga-based oxide, a three-component metal oxide such as an In—Ga—Zn-based oxide (also referred to as IGZO), an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, or an In—Sn—Hf—Zn-based oxide, and the like.

Note that here, for example, an "In—Ga—Zn-based oxide" means an oxide containing In, Ga, and Zn and there is no particular limitation on the ratio of In to Ga and Zn. The In—Ga—Z-based oxide may contain another metal element in addition to In, Ga, and Zn.

The relative density (fill rate) of a metal oxide target is 90% to 100% inclusive, preferably 95% to 99.9% inclusive. By using the metal oxide target with high relative density, a dense film can be formed as the oxide semiconductor layer.

As a sputtering gas used when the oxide semiconductor layer is formed, it is preferable to use a high-purity gas from which impurities such as hydrogen, water, a hydroxyl group, or a hydride are removed.

The oxide semiconductor layer preferably has a crystal structure. The oxide semiconductor layer having a crystal structure is a single crystal film, a polycrystalline film (also referred to as polycrystal), a microcrystalline film, or a c-axis aligned crystalline oxide semiconductor (CAAC-OS) film.

The CAAC-OS film is not completely single crystal nor completely amorphous. The CAAC-OS film is an oxide semiconductor film including crystal parts. Note that in most cases, the crystal part fits inside a cube whose one side is less than 100 nm. In an image obtained with a transmission electron microscope (TEM), a grain boundary in the CAAC-OS film cannot be found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In other words, because the a-axis and the b-axis vary among the crystal parts in the CAAC-OS film although the c-axes are aligned, the CAAC-OS film is not an epitaxially grown film. In this specification, a simple term "perpendicular" includes a range of 85° to 95° inclusive. In addition, a simple term "parallel" includes a range of −5° to 5° inclusive.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. By adding impurities to the CAAC-OS film, crystallinity of a crystal part in a region to which the impurities are added is reduced, and depending on the conditions for adding impurities, the region becomes a microcrystalline region or an amorphous region in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the direction of the c-axis of the crystal portion is the direction parallel to a normal vector of the surface where the CAAC-OS film is formed or a normal vector of the surface of the CAAC-OS film. The crystal part is formed by film formation or by performing treatment for crystallization such as heat treatment after film formation.

In an oxide semiconductor having a crystal portion such as the CAAC-OS, defects in the bulk can be further reduced and when the surface flatness of the oxide semiconductor is improved, mobility higher than that of an oxide semiconductor in an amorphous state can be obtained. To improve the surface flatness, the oxide semiconductor is preferably formed over a flat surface. Specifically, the oxide semiconductor is preferably formed over a surface with an average surface roughness ($R_a$) less than or equal to 1 nm, more preferably less than or equal to 0.3 nm, still more preferably less than or equal to 0.1 nm.

With use of the CAAC-OS film in a transistor, changes in the electrical characteristics of the transistor due to irradiation with visible light or ultraviolet light can be reduced. Thus, by using a CAAC-OS film as the oxide semiconductor film, it is possible to provide a highly reliable semiconductor device in which changes in the electrical characteristics of the transistor due to irradiation with visible light or ultraviolet light can be suppressed.

As the transistor, a top-gate transistor, a bottom-gate transistor, or a dual-gate transistor having gate electrode layers in upper and lower portions can be used. A transistor including an oxide semiconductor enables charge to be held for a long time owing to its characteristics.

To form the element layer 102 including a photodiode, part of another semiconductor substrate is separated by a hydrogen ion implantation separation method or the like, so that a single crystal semiconductor layer is formed over the element layer 101 including an oxide semiconductor layer. The hydrogen ion implantation separation method is a method in which hydrogen ions are implanted into a silicon wafer to form a microbubble layer at a predetermined depth from the surface and, using the microbubble layer as a cleavage plane, a thin silicon layer is bonded to another silicon wafer.

Before or after the separation by a hydrogen ion implantation separation method, as the element layer 102 including a photodiode, a p-type impurity layer containing an impurity element imparting p-type conductivity or an n-type impurity layer containing an impurity element imparting n-type conductivity is formed. In this embodiment, a pin-type photodiode in which, over a p-type impurity layer containing an impurity element imparting p-type conductivity, an i-type layer and an n-type impurity layer are stacked so that the layers are interposed between a pair of electrodes is formed.

Elements included in the semiconductor substrate 100, the element layer 101, and the element layer 102 are combined as appropriate to form a photodetection circuit, so that the solid-state image sensing device is fabricated.

A plurality of photodiodes may be formed and arranged in a matrix so that color filters such as a red color filter, a green color filter, and a blue color filter which overlap their respective photodiodes can be provided in the solid-state image sensing device. The photodiode overlapping the red color filter generates charge corresponding to a red color signal, the photodiode overlapping the green color filter generates charge corresponding to a green color signal, and the photodiode overlapping the blue color filter generates charge corresponding to a blue color signal.

Alternatively, since the element layer including an oxide semiconductor layer has a light-transmitting property, a structure in which the order of stacking the two different element layers is reversed is also possible. An example of the structure is illustrated in FIG. 1B. In the example in FIG. 1B, a driver circuit including a first transistor on the semiconductor substrate 100, the element layer 101 including a second transistor including an oxide semiconductor layer in a channel formation region over the semiconductor substrate 100, and the element layer 102 including a photodiode over the semiconductor substrate 100 are provided so that the element layer 101 is stacked over the element layer 102.

In the structure in FIG. 1B, over the semiconductor substrate 100 provided with the driver circuit such as an amplifier circuit, the single crystal semiconductor layer is formed by the separation of part of the semiconductor substrate using a hydrogen ion implantation separation method or the like. Before or after the separation by a hydrogen ion implantation separation method, as the element layer 102 including a photodiode, a p-type impurity layer containing an impurity element imparting p-type conductivity or an n-type impurity layer containing an impurity element imparting n-type conductivity is formed. Then, the oxide semiconductor layer is formed over the element layer 102 including a photodiode to form the transistor including an oxide semiconductor layer in a channel formation region; thus, the structure in FIG. 1B can be obtained.

Embodiment 2

In this embodiment, an example of the photodetection circuit including elements included in the semiconductor substrate 100, the element layer 101, and the element layer 102 in appropriate combination which is described in Embodiment 1 is described.

Figure 2A:
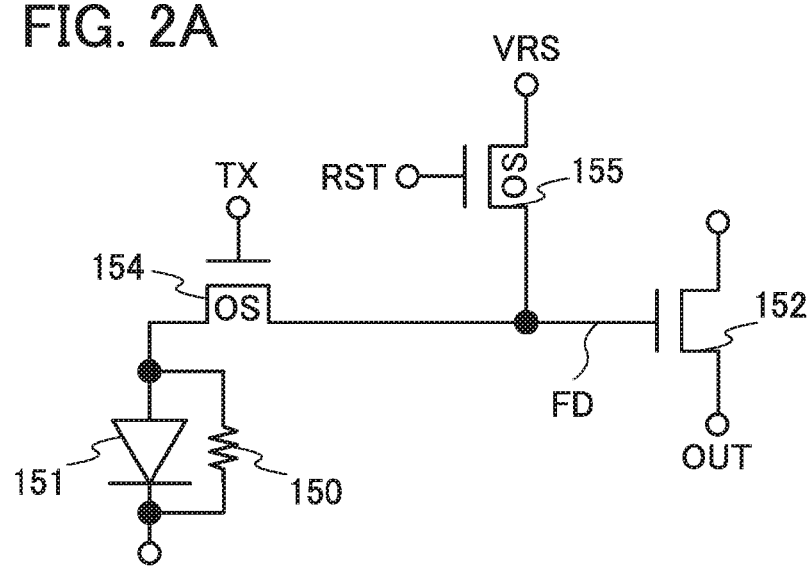
FIG. 2A is an example of an equivalent circuit illustrating one embodiment of the present invention and FIG. 2B is a timing chart.
Figure 2B:
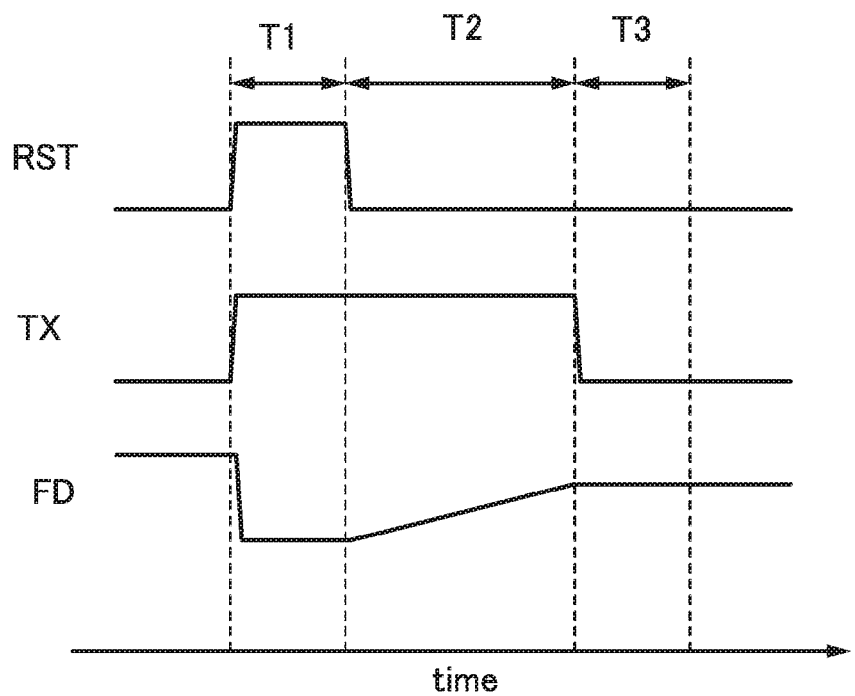

An example of the photodetector circuit in accordance with this embodiment is described with reference to FIGS. 2A and 2B. FIGS. 2A and 2B illustrate the example of the photodetection circuit in accordance with this embodiment. The photodetection circuit has a structure in which two different element layers (an element layer including an oxide semiconductor layer and an element layer including a photodiode) are stacked over a semiconductor substrate provided with a driver circuit such as an amplifier circuit and which is described in Embodiment 1.

First, a structure example of the photodetection circuit in accordance with this embodiment is described with reference to FIG. 2A.

The photodetection circuit illustrated in FIG. 2A includes a photodiode 151, a transistor 152, a transistor 154, and a transistor 155.

A high power supply potential VDD is supplied to a cathode of the photodiode 151. Note that a load resistor 150 is present between an anode and the cathode of the photodiode 151.

One of a source and a drain of the transistor 154 is electrically connected to the anode of the photodiode 151, and a charge accumulation control signal TX is input to a gate of the transistor 154. The transistor 154 functions as a charge accumulation control transistor. The charge accumulation control transistor has a function of controlling whether or not the potential of a gate of an amplifier transistor is set to a value corresponding to a photocurrent generated by the photodiode 151.

A low power supply potential VSS is supplied to one of a source and a drain of the transistor 152, and the potential of the other of the source and the drain of the transistor 152 becomes the potential of an output signal OUT, which is optical data output from the photodetection circuit. Further, a gate of the transistor 152 is electrically connected to the other of the source and the drain of the transistor 154. A portion where the gate of the transistor 152 and the other of the source and the drain of the transistor 154 are connected to each other is referred to as a node FD. The transistor 152 functions as the amplifier transistor which amplifies the photocurrent generated by the photodiode 151. Note that the other of the source and the drain of the transistor 152 may be connected to a source or a drain of a switch transistor.

A reset potential VRS is supplied to one of a source and a drain of the transistor 155. The other of the source and the drain of the transistor 155 is electrically connected to the other of the source and the drain of the transistor 154. A reset signal RST is input to a gate of the transistor 155. The transistor 155 functions as a photodetection reset transistor. The photodetection reset transistor has a function of determining whether or not the potential of the gate of the amplifier transistor (the potential of the node FD) is set to the reset potential VRS.

Note that when a plurality of photodetection circuits as illustrated in FIG. 2A is used, the same charge storage control signal can be input to all the photodetection circuits. A driving method in which the same charge storage control signal is input to all the photodetection circuits to generate optical data is also called a global shutter method.

As the transistor 152, a transistor including silicon in a channel formation region can be used. As each of the transistors 154 and 155, a transistor including an oxide semiconductor in a channel formation region can be used. The off-state current of the transistor including an oxide semiconductor is low, and accordingly, variations in the potential of the gate of the transistor 152 can be suppressed.

Next, an example of a method of driving the photodetection circuit illustrated in FIG. 2A is described with reference to a timing chart in FIG. 2B. Note that for example, the reset potential VRS is assumed to be equivalent to the low power supply potential VSS.

As illustrated in FIG. 2B, in the example of the method of driving the photodetection circuit illustrated in FIG. 2A, first, in a period T1, a pulse of the reset signal RST is input. In addition, in the period T1 and a period T2, a pulse of the charge accumulation control signal TX is input. Note that in the period T1, the timing for starting input of the pulse of the reset signal RST may be earlier than the timing for starting input of the pulse of the charge accumulation control signal TX.

In this case, by turning on the transistors 154 and 155, the potential of the gate of the transistor 152 (the potential of the node FD) becomes equivalent to the reset potential VRS.

Further, in the period T2, the transistor 155 is turned off and the transistor 154 remains on.

At this time, a photocurrent flows between the anode and the cathode of the photodiode 151 in accordance with the illuminance of light incident on the photodiode 151. Further, the value of the potential of the gate of the transistor 152 (the potential of the node FD) varies depending on the photocurrent. In this case, channel resistance between the source and the drain of the transistor 152 is changed.

Next, in the period T3, the transistor 154 is turned off.

At this time, the potential of the gate of the transistor 152 (the potential of the node FD) is kept at a value corresponding to the photocurrent of the photodiode 151 in the period T2.

Further, the potential of the other of the source and the drain of the transistor 152 is output as the output signal OUT, so that optical data is output from the photodetection circuit. The above is the example of the method of driving the photodetection circuit illustrated in FIG. 2A.

Figure 3:
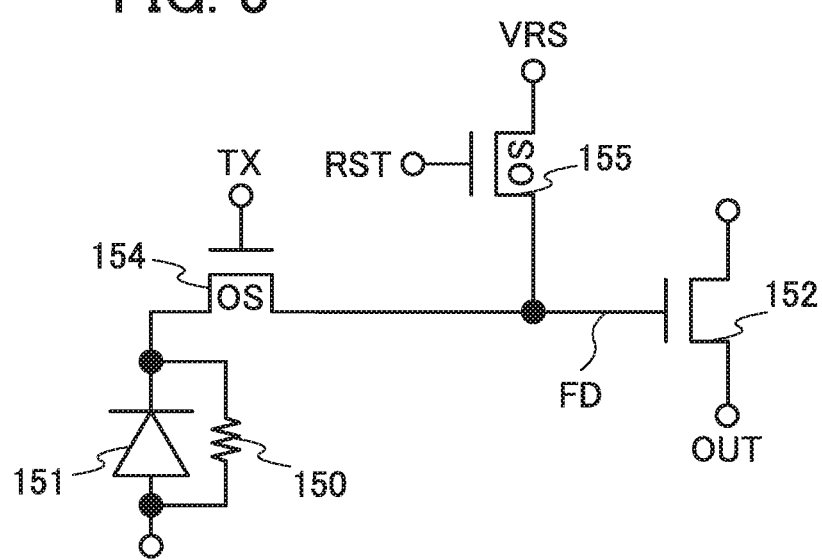
FIG. 3 is an example of an equivalent circuit illustrating one embodiment of the present invention.

Note that as illustrated in FIG. 3, the connection relation between the anode and the cathode of the photodiode 151 may be reversed. In that case, the low power supply potential VSS is supplied to the anode of the photodiode 151, the cathode of the photodiode 151 is electrically connected to the one of the source and the drain of the transistor 154, and the high power supply potential VDD is supplied to the one of the source and the drain of the transistor 152.

As described with reference to FIGS. 2A and 2B and FIG. 3, in an example of the photodetection circuit of this embodiment, transistors whose off-state current is low are used as the charge accumulation control transistor and the reset transistor, so that variations in the potential of the gate of the amplifier transistor can be suppressed.

Accordingly, the accuracy of generated data can be improved. This embodiment can be freely combined with Embodiment 1.

Embodiment 3

In this embodiment, an example of a cross-sectional structure of a solid-state image sensing device including the photodetection circuit described in Embodiment 2 is described with reference to FIG. 4. Note that the same reference numerals in FIGS. 2A and 2B, FIG. 3, and FIG. 4 represent components that are identical or have similar functions.

Figure 4:
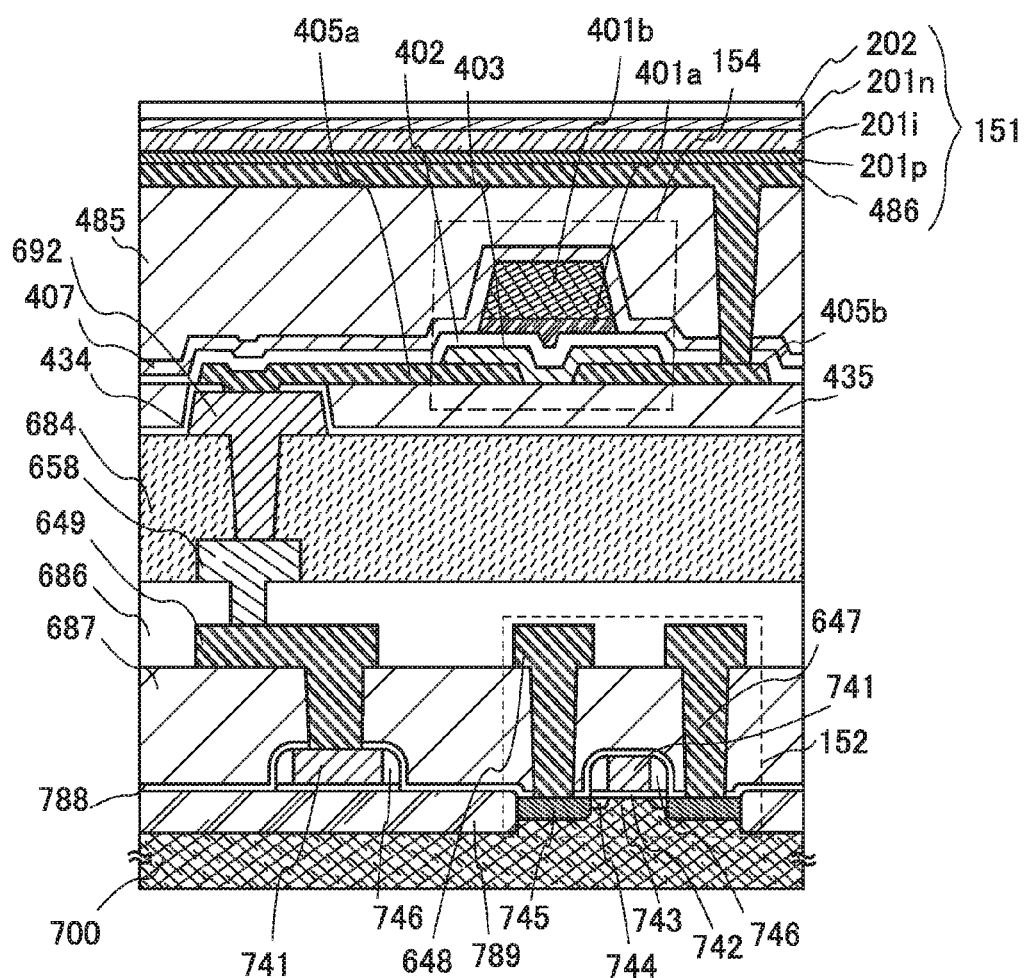
FIG. 4 illustrates a cross-sectional structure of one embodiment of the present invention.

FIG. 4 illustrates an example in which the transistor 154 overlaps the transistor 152 and the photodiode 151 overlaps the transistor 154. Such a stacked layer structure achieves higher integration.

The solid-state image sensing device illustrated in FIG. 4 includes the transistor 152 including a first semiconductor material in a lower portion, and a transistor 154 including a second semiconductor material in an upper portion.

Here, the first semiconductor material and the second semiconductor material are preferably materials having different band gaps. For example, the first semiconductor material can be a semiconductor material other than an oxide semiconductor (e.g., silicon) and the second semiconductor material can be an oxide semiconductor. A transistor including a material such as silicon can operate at high speed easily. A transistor including an oxide semiconductor enables charge to be held for a long time owing to its characteristics.

In this embodiment, the single crystal silicon substrate imparting p-type conductivity is used as the substrate 700, and an impurity element imparting n-type conductivity is added to form an n-type impurity region 744 functioning as a lightly doped drain (LDD) region or an extension region and an n-type impurity region 745 functioning as a source region or a drain region. The transistor 152 is an n-channel transistor and includes a channel formation region 743, the n-type impurity region 744, the n-type impurity region 745 functioning as a source region or a drain region, a gate insulating film 742, and a gate electrode layer 741. The n-type impurity region 745 has a higher impurity concentration than the n-type impurity region 744. A side surface of the gate electrode layer 741 is provided with a sidewall insulating layer 746. With the use of the gate electrode layer 741 and the sidewall insulating layer 746 as masks, the n-type impurity region 744 and the n-type impurity region 745 which have different impurity concentrations can be formed in a self-aligned manner.

In the substrate 700, the transistor 152 is isolated from an adjacent transistor by an element isolation region 789. An insulating film 788 and an insulating film 687 are stacked over the transistor 152. Over the insulating film 687, a wiring layer 647 and a wiring layer 648 in contact with the n-type impurity region 745 through openings in the insulating film 788 and the insulating film 687 are provided. A wiring layer 649 electrically connected to the gate electrode layer 741 of the transistor 152 is also provided over the insulating film 687. Note that as illustrated in FIG. 4, the gate electrode layer 741 is lead so as to overlap the element isolation region 789 and electrically connected to the wiring layer 649 through a contact hole formed over the element isolation region 789.

The semiconductor device of this embodiment is not limited to the structure in FIG. 4. As the transistor 152, a transistor including silicide or a transistor which does not include a sidewall insulating layer may be used. When a structure that contains silicide is used, the resistance of the source region and the drain region can be further lowered and the operation speed of the semiconductor device is increased. Further, the semiconductor device can be operated at low voltage, so that power consumption of the semiconductor device can be reduced.

Next, structures of elements in the upper portion over the transistor 152 in the lower portion in the semiconductor device in FIG. 4 are described.

An insulating film 684 is stacked over the insulating film 686 and the wiring layer 658, and over the insulating film 684, a wiring layer 692 is formed. The insulating film 434 is provided so as to cover the wiring layer 692. Over the insulating film 434, an oxide semiconductor layer 403 and a gate insulating film 402 are provided, and thereover, a gate electrode layer 401a and a gate electrode layer 401b are provided.

The wiring layer 692 is electrically connected to the wiring layer 658 through an opening in the insulating film 684. In the example in this embodiment, the insulating film 684 is subjected to planarization treatment using a CMP method.

The insulating film 434 is provided between the lower portion and the upper portion in the semiconductor device. The insulating film 434 functions as a barrier film for preventing impurities such as hydrogen which cause degradation or changes in the electrical characteristics of the transistor 154 from entering the upper portion from the lower portion. Thus, the insulating film 434 is preferably formed using a fine inorganic insulating film (e.g., an aluminum oxide film or a silicon nitride film) having a good property of blocking impurities or the like.

A method of fabricating the transistor 154 is briefly described below.

The wiring layer 692 is formed over the insulating film 684 provided over the transistor 152.

Next, the insulating film 434 is formed so as to cover the wiring layer 692.

Next, an oxide insulating film having projecting portions reflecting the shape of the wiring layer 692 is formed over the insulating film 434. Then, the oxide insulating film is subjected to CMP treatment, whereby the oxide insulating film over the wiring layer 692 is selectively removed and the surface of the oxide insulating film is planarized. Accordingly, a planarized oxide insulating film 435 is formed.

Next, part of the insulating film 434 over the top surface of the wiring layer 692 is selectively removed, so that an opening for exposing the top surface of the wiring layer 692 is formed.

Next, a conductive film is formed by a sputtering method or the like and selectively etched, so that an electrode layer 405a and an electrode layer 405b functioning as a source electrode and a drain electrode are formed.

Next, the oxide semiconductor layer 403 is formed over the electrode layer 405a and the electrode layer 405b by a sputtering method and selectively etched with one photomask.

The oxide semiconductor layer 403 is formed to be what we call a CAAC-OS film using an oxide target in which the atomic ratio of In to Ga and Zn is 1:1:1 in an oxygen atmosphere (oxygen: 100%). The film includes a crystal part in which c-axes are aligned in the direction parallel to a normal vector of a surface where the film is formed or a normal vector of a surface of the film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. An example in which the oxide semiconductor film includes crystal parts shortly after the oxide semiconductor film is formed is described in this embodiment; however, crystal parts may be formed by performing heat treatment after the film formation.

Next, the gate insulating film 402 is formed over the oxide semiconductor layer 403. In this embodiment, a gallium oxide film is used as a material of the gate insulating film 402.

Next, a conductive film is formed over the gate insulating film 402 by a sputtering method, an evaporation method, or the like. The conductive film is etched so that the gate electrode layers 401a and 401b are formed. Through the above-described process, the transistor 154 is formed.

Next, an insulating film 407 and an interlayer insulating film 485 are formed over the transistor 154. In this manner, the element layer including the transistor 154 is formed. Then, an opening reaching the electrode layer 405b is formed in the interlayer insulating film 485, and a first electrode layer 486 is formed. These first electrode layers are arranged in a matrix. Then, after an insulating film is formed so as to cover the first electrode layer, planarization treatment such as CMP is performed and the top surface of the first electrode layer is exposed. Further, a semiconductor device having a multilayer structure in which an embedded wiring is formed in the interlayer insulating film 485 and another semiconductor element, another wiring, or the like is formed above the embedded wiring may be manufactured.

Next, an example in which the photodiode 151 is fabricated over the transistor 154 is described.

Another semiconductor substrate not illustrated is prepared, and part of the semiconductor substrate is separated by a hydrogen ion implantation separation method or the like, so that a single crystal semiconductor layer is formed over the element layer including an oxide semiconductor layer.

Next, a p-type impurity element is added to the single crystal semiconductor layer to form a p-type impurity layer 201p and an n-type impurity element is added to the single crystal semiconductor layer to form an n-type impurity layer 201n. An i-type layer 201i is formed between the p-type impurity layer 201p and the n-type impurity layer 201n. Then, a light-transmitting conductive film 202 is formed over the n-type impurity layer 201n, so that the photodiode 151 which receives light from above is fabricated. It is needless to say that the method of manufacturing the photodiode 151 is not limited to the above manufacturing method. For example, the p-type impurity layer 201p may be formed by a plasma CVD method.

In the thus fabricated solid-state image sensing device, charge between the transistor 154 and the transistor 152 is held by turning off the transistor 154 even when charge slightly leaks into the photodiode. Accordingly, margin can be increased and yield can be improved.

The structure in FIG. 4 does not limit the present invention as long as the photodetection circuit described in Embodiment 2 can be provided. Elements included in the semiconductor substrate 100, the element layer 101, and the element layer 102 which are described in Embodiment 1 are connected as appropriate to electrode layers by using wirings and an extraction terminal or the like is fabricated.

Figure 5:
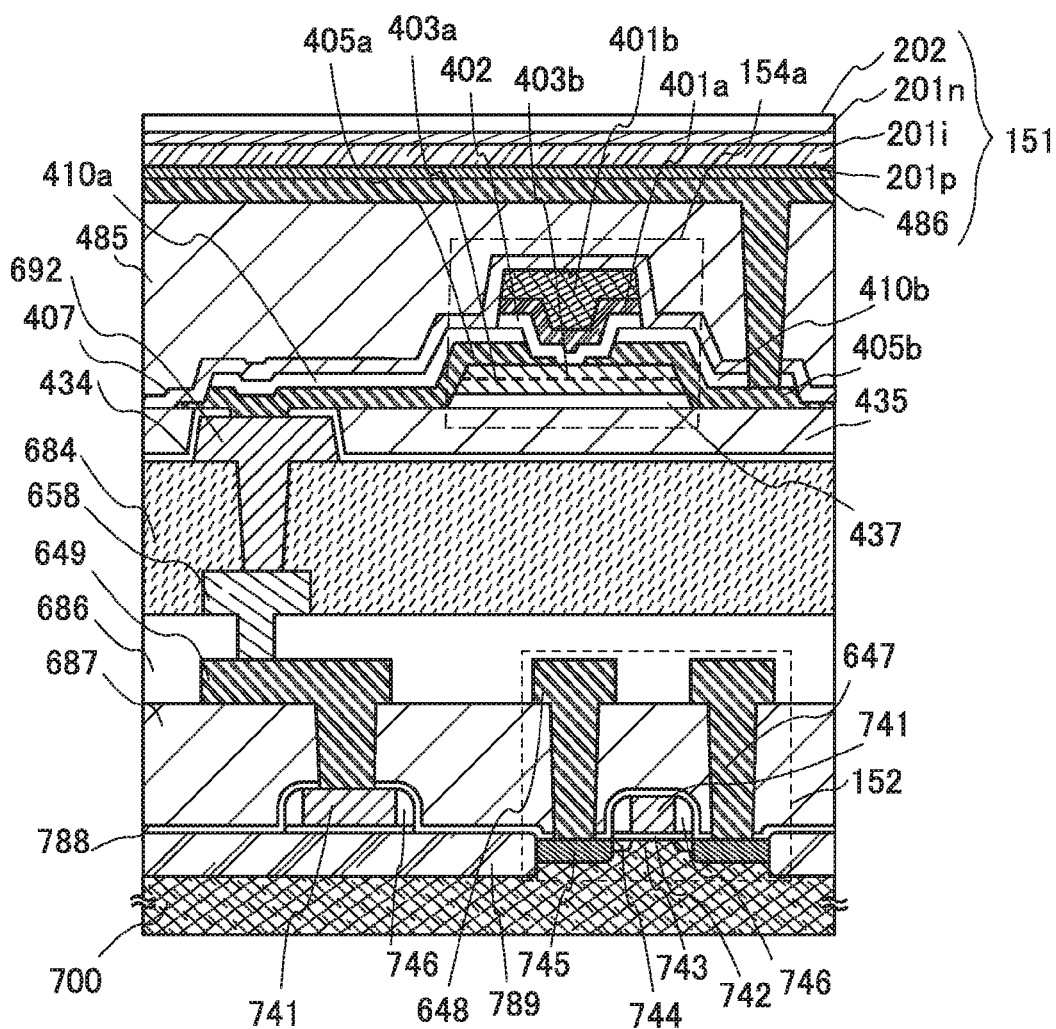
FIG. 5 illustrates a cross-sectional structure of one embodiment of the present invention.

Another example of a structure different from that in FIG. 4 is illustrated in FIG. 5. In FIG. 5, only the structure of the transistor is different from that in FIG. 4 and the other structure is the same as that in FIG. 4, and hence only the difference is shown.

In an example in FIG. 5, in the transistor 154a, an insulating film 437 including gallium oxide is provided between the oxide insulating film 435 and stacked oxide semiconductor layers. The electrode layers 405a and 405b are formed over the stacked oxide semiconductor layers, and a first protective layer 410a over the electrode layer 405a and a second protective layer 410b over the electrode layer 405b are formed.

The transistor 154a illustrated in FIG. 5 has a stacked layer structure in which a second oxide semiconductor layer 403b having a composition different from that of a first oxide semiconductor layer 403a is formed over the first oxide semiconductor layer 403a.

As the first oxide semiconductor layer 403a, an In—Ga—Zn-based oxide film formed with a target in which the atomic ratio of In to Ga and Zn is 3:1:2 is used. Note that the first oxide semiconductor layer 403a contains more In than Ga and Zn in an atomic ratio. As the second oxide semiconductor layer 403b, an In—Ga—Zn-based oxide film formed with a target in which the atomic ratio of In to Ga and Zn is 1:1:1 is used.

In the case where stacked oxide semiconductor layers having different compositions are used, the stacked oxide semiconductor layers are formed so that an upper layer of the stacked layers remains and thus a lower layer of the stacked layers (the first oxide semiconductor layer 403a in this embodiment) is not exposed.

An In—Ga—Zn-based oxide film formed with a target in which the atomic ratio of In to Ga and Zn is 3:1:2 is used for a channel formation region of the transistor 154a in FIG. 5, and accordingly field-effect mobility can be improved.

The first protective layer 410a over the electrode layer 405a and the second protective layer 410b over the electrode layer 405b are formed as follows. A conductive film is formed over the second oxide semiconductor layer 403b by a sputtering method or the like, and a silicon oxide film is formed over the conductive film. Next, a resist mask is formed over the silicon oxide film, and first etching is performed to remove the conductive film to approximately half the thickness so that the silicon oxide film partly has a small thickness. Ashing is performed on the resist mask for reducing the area of the resist mask. After that, second etching is performed with the resist mask, which is reduced in size, so that the electrode layers 405a and 405b each including a region projected from a side surface in its lower end portion are formed. The first protective layer 410a remains over a region of the electrode layer 405a which has a large thickness, and the second protective layer 410b remains over a region of the electrode layer 405b which has a large thickness. The first protective layer 410a and the second protective layer 410b reduce parasitic capacitance formed between a gate electrode layer and a source electrode layer and parasitic capacitance formed between the gate electrode layer and a drain electrode layer in the transistor 154a.

Figure 6:
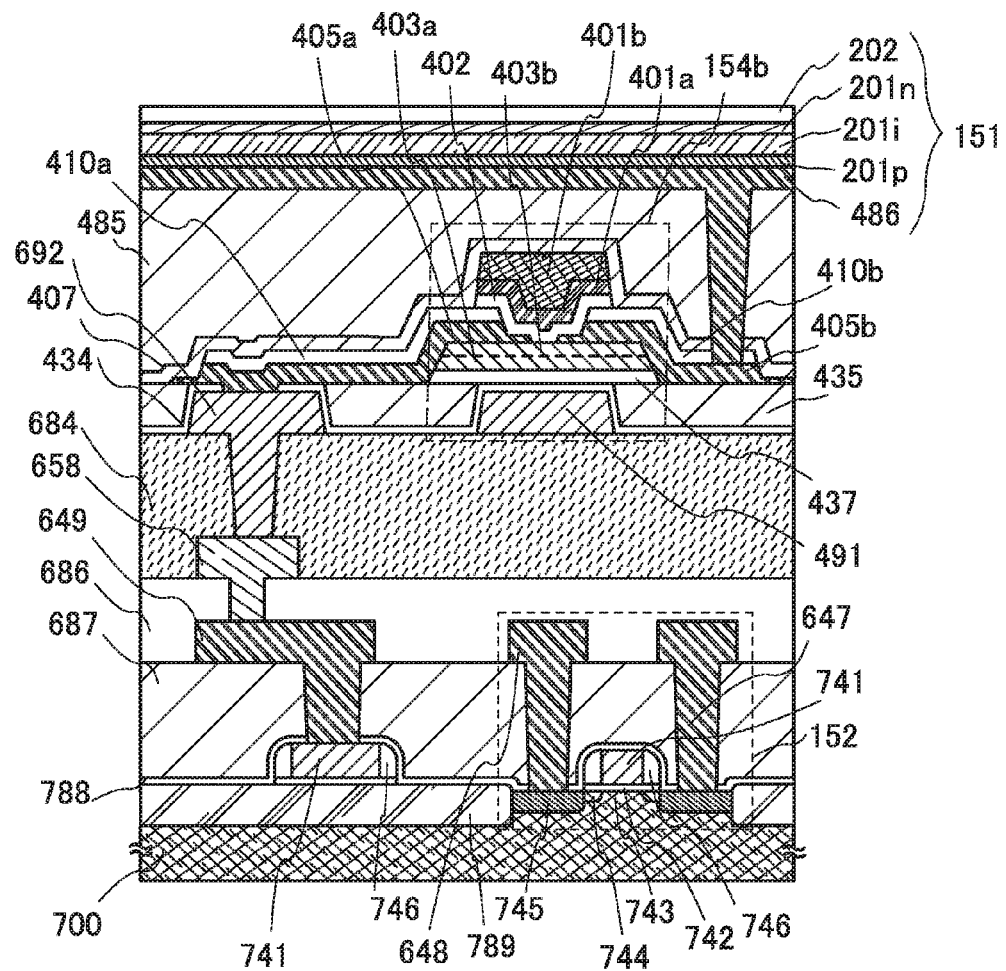
FIG. 6 illustrates a cross-sectional structure of one embodiment of the present invention.

Another example of a structure partly different from that in FIG. 5 is illustrated in FIG. 6. In FIG. 6, only the structure of the transistor is different from that in FIG. 5 and the other structure is the same as that in FIG. 5, and hence only the difference is shown.

FIG. 6 illustrates an example in which a conductive layer 491 is provided in the oxide insulating film 435. The conductive layer 491 overlaps the gate electrode layers 401a and 401b of the transistor 154b with a channel formation region positioned therebetween, and controls the electrical characteristics of the transistor 154b.

The conductive layer 491 can function as a second gate electrode layer (also referred to as a so-called back gate) which controls the electrical characteristics of the transistor 154b. For example, by setting the potential of the conductive layer 491 to GND (or a fixed potential), the threshold voltage of the transistor 154b is increased, so that the transistor 154b can be normally off.

Note that the conductive layer 491 can be fabricated in the same step as the wiring layer 692.

In addition, this embodiment can be freely combined with Embodiment 1 or Embodiment 2.

Embodiment 4

A semiconductor device disclosed in this specification can be applied to a variety of electronic devices (including game machines). Examples of the electronic devices include display devices of televisions, monitors, and the like, lighting devices, desktop personal computers and laptop personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, portable wireless devices, mobile phones, car phones, portable game machines, calculators, portable information terminals, electronic notebooks, e-book readers, electronic translators, audio input devices, cameras such as still cameras and video cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, smoke detectors, radiation counters, and medical equipment such as dialyzers. Further, the examples include industrial equipment such as guide lights, traffic lights, belt conveyors, elevators, escalators, industrial robots, and power storage systems. In addition, oil engines, moving objects driven by electric motors using power from the non-aqueous secondary batteries, and the like are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, spacecrafts, and the like. Specific examples of these electronic devices are illustrated in FIGS. 7A to 7C and FIGS. 8A to 8C.

FIGS. 7A and 7B illustrate a tablet terminal that can be folded in two. FIG. 7A illustrates the tablet terminal which is open. The tablet terminal includes a housing 9630, a display portion 9631a, a display portion 9631b, a switch 9034 for switching display modes, a power switch 9035, a switch 9036 for switching to power-saving mode, a fastener 9033, an operation switch 9038, and a solid-state image sensing device 9605. In this specification, the solid-state image sensing device 9605 may refer to a solid-state image sensing device including an optical system such as a lens.

In such a portable device illustrated in FIGS. 7A and 7B, an SRAM or a DRAM is used as a memory element for temporarily storing image data. For example, the semiconductor device described in Embodiment 1 can be used as the solid-state image sensing device 9605. By employing the solid-state image sensing device 9605 according to Embodiment 1, high detection accuracy for imaging can be obtained and power consumption can be sufficiently reduced.

Part of the display portion 9631a can be a touch panel region 9632a, and data can be input by touching operation keys 9638 that are displayed. Note that in an illustrated example, that half of the area of the display portion 9631a has only a display function and the other half of the area has a touch panel function. However, the structure of the display portion 9631a is not limited to this, and all the area of the display portion 9631a may have a touch panel function. For example, all the area of the display portion 9631a can display keyboard buttons and serve as a touch panel while the display portion 9631b can be used as a display screen.

Like the display portion 9631a, part of the display portion 9631b can be a touch panel region 9632b. When a finger, a stylus, or the like touches the place where a button 9639 for switching to keyboard display is displayed on the touch panel, keyboard buttons can be displayed on the display portion 9631b.

Touch input can be performed concurrently on the touch panel regions 9632a and 9632b.

The switch 9034 for switching display modes can switch display orientation (e.g., between landscape mode and portrait mode) and select a display mode (switch between monochrome display and color display), for example. With the switch 9036 for switching to power-saving mode, the luminance of display can be optimized in accordance with the amount of external light at the time when the tablet terminal is in use, which is detected with the solid-state image sensing device incorporated in the tablet terminal. The tablet terminal may include another detection device such as a sensor for detecting orientation (e.g., a gyroscope or an acceleration sensor) in addition to the solid-state image sensing device.

Although the display portion 9631a and the display portion 9631b have the same display area in FIG. 7A, an embodiment of the present invention is not limited to this example. They may differ in size and/or image quality. For example, one of them may be a display panel that can display higher-definition images than the other.

FIG. 7B illustrates the tablet terminal folded, which includes the housing 9630, a solar battery 9633, a charge and discharge control circuit 9634, a battery 9635, and a DCDC converter 9636. Note that FIG. 7B shows an example in which the charge and discharge control circuit 9634 includes the battery 9635 and the DCDC converter 9636.

Since the tablet can be folded in two, the housing 9630 can be closed when the tablet is not in use. Thus, the display portions 9631a and 9631b can be protected, thereby providing a tablet with high endurance and high reliability for long-term use.

The tablet terminal illustrated in FIGS. 7A and 7B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar battery 9633, which is attached on the surface of the tablet terminal, supplies electric power to a touch panel, a display portion, an image signal processor, and the like. Provision of the solar battery 9633 is preferable in that the battery 9635 can be charged efficiently for one or two surfaces of the housing 9630. When a lithium ion battery is used as the battery 9635, there is an advantage of downsizing or the like.

The structure and operation of the charge and discharge control circuit 9634 illustrated in FIG. 7B are described with reference to a block diagram of FIG. 7C. FIG. 7C illustrates the solar battery 9633, the battery 9635, the DCDC converter 9636, a converter 9637, switches SW1 to SW3, and the display portion 9631. The battery 9635, the DCDC converter 9636, the converter 9637, and the switches SW1 to SW3 correspond to the charge and discharge control circuit 9634 in FIG. 7B.

First, an example of operation in the case where power is generated by the solar battery 9633 using external light is described. The voltage of power generated by the solar battery 9633 is raised or lowered by the DCDC converter 9636 so that a voltage for charging the battery 9635 is obtained. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and a switch SW2 is turned on so that charge of the battery 9635 may be performed.

Note that the solar battery 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

Figure 8A:
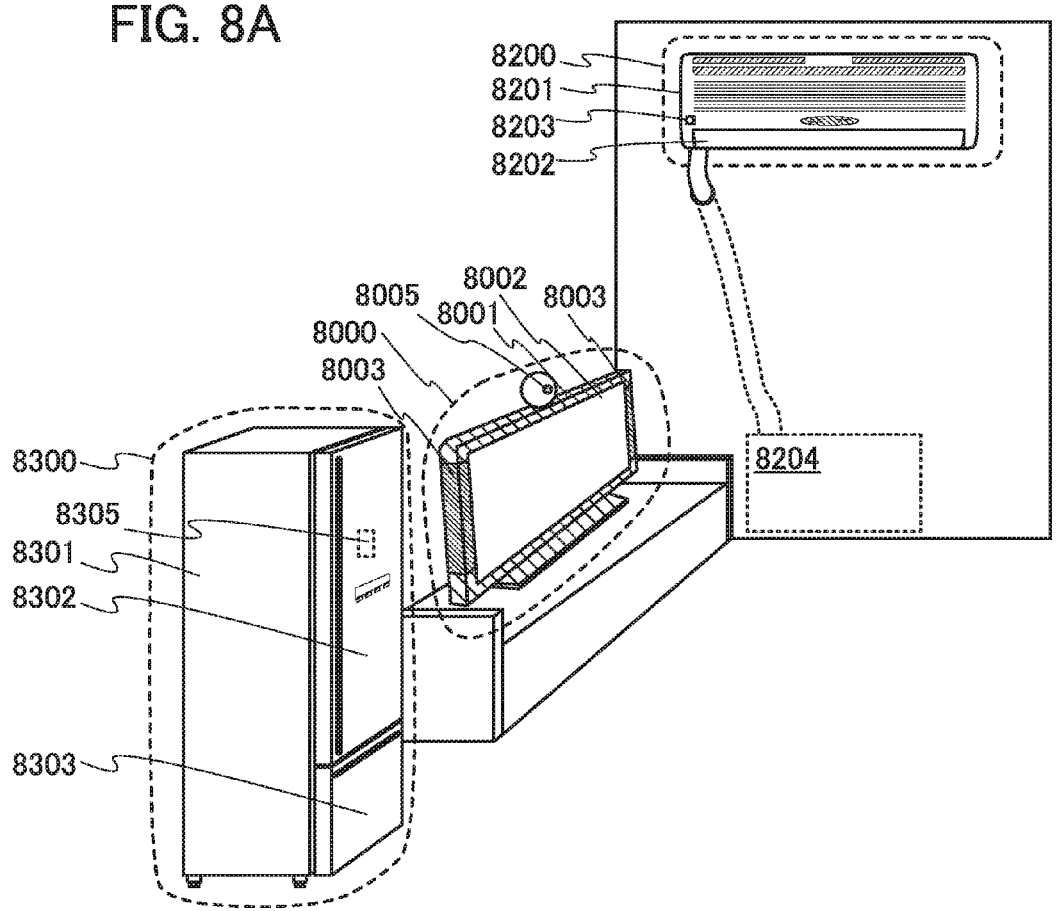
FIGS. 8A to 8C illustrate electronic devices.

In a television device 8000 in FIG. 8A, a display portion 8002 is incorporated in a housing 8001. The display portion 8002 displays an image and a speaker portion 8003 can output sound. In addition, imaging can be performed by a solid-state image sensing device 8005. The solid-state image sensing device described in Embodiment 1 can be used as the solid-state image sensing device 8005.

A semiconductor display device such as a liquid crystal display device, a light-emitting device in which a light-emitting element such as an organic EL element is provided in each pixel, an electrophoresis display device, a digital micromirror device (DMD), or a plasma display panel (PDP) can be used for the display portion 8002.

The television device 8000 may be provided with a receiver, a modem, and the like. Furthermore, when the television device 8000 is connected to a communication network by wired or wireless connection via the modem, one-way (from a transmitter to a receiver) or two-way (between a transmitter and a receiver, between receivers, or the like) data communication can be performed. For example, an image taken by the solid-state image sensing device 8005 can be transmitted via a communication network.

In FIG. 8A, an air conditioner which includes an indoor unit 8200 and an outdoor unit 8204 is an example of an electronic device in which the solid-state image sensing device 8005 according to Embodiment 1 is used. Specifically, the indoor unit 8200 includes a housing 8201, an air outlet 8202, a solid-state image sensing device 8203, and the like. In FIG. 8A, the solid-state image sensing device 8203 is provided in the indoor unit 8200. Since the solid-state image sensing device 8203 according to Embodiment 1 is capable of imaging, the number of people in the room, for example, can be identified, which enables temperature adjustment based on such information. When the solid-state image sensing device 8203 identifies nobody in the room, the air conditioner can be automatically turned off so that power consumption can be reduced.

In FIG. 8A, an electric refrigerator-freezer 8300 is an example of an electronic device which is provided with a solid-state image sensing device 8305. Specifically, the electric refrigerator-freezer 8300 includes a housing 8301, a door for a refrigerator 8302, a door for a freezer 8303, the solid-state image sensing device 8305, and the like. The solid-state image sensing device 8305 is provided in the housing 8301 in FIG. 8A. By using the solid-state image sensing device described in Embodiment 1 as the solid-state image sensing device 8305 of the electric refrigerator-freezer 8300, an image of the inside can be taken and the temperature thereof can be adjusted based on the image, which leads to lower power consumption. Further, the image of the inside of the electric refrigerator-freezer 8300 which is taken by the solid-state image sensing device 8305 is transmitted to the television device 8000 so that the image is displayed by the television device 8000, whereby what is in the electric refrigerator-freezer 8300 can be checked without opening the door of the electric refrigerator-freezer 8300. Thus, power consumed for adjusting a temperature change due to opening and closing can be reduced. It is needless to say that, when an image of the inside of the electric refrigerator-freezer 8300 is taken by the solid-state image sensing device 8305, lighting inside the electric refrigerator-freezer 8300 is turned on. Note that a plurality of solid-state image sensing devices 8305 may be provided so that an image of the inside of the electric refrigerator-freezer 8300 is identified in detail.

Figure 8B:
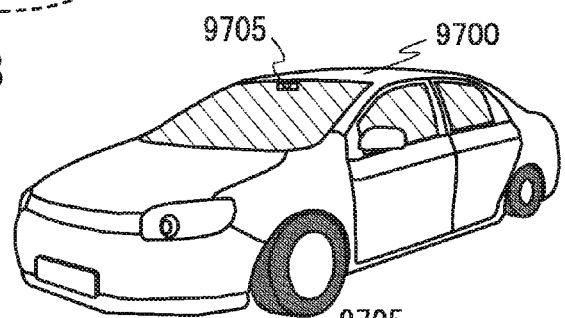
Figure 8C:
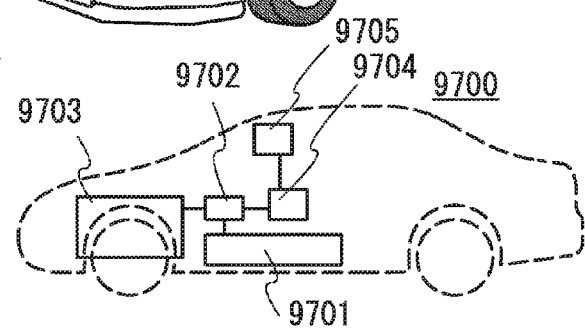

FIG. 8B illustrates an example of an electric vehicle. An electric vehicle 9700 is equipped with a secondary battery 9701. The output of the electric power of the secondary battery 9701 is adjusted by a control circuit 9702 so that the electric power is supplied to a driving device 9703. The control circuit 9702 is controlled by a processing unit 9704 including a ROM, a RAM, a CPU, or the like which is not illustrated. A solid-state image sensing device 9705 according to Embodiment 1 can be incorporated in the electric vehicle 9700 to be used as a drive recorder.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, data on a load on a driving wheel, or a front image taken by the solid-state image sensing device 9705) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This embodiment can be implemented combining with another embodiment as appropriate.

This application is based on Japanese Patent Application serial No. 2012-100494 filed with the Japan Patent Office on Apr. 25, 2012, the entire contents of which are hereby incorporated by reference.

What is claimed is:

1. A semiconductor device comprising:
a semiconductor substrate;
a first transistor comprising a first channel formation region;
an interlayer insulating film over the first transistor and the semiconductor substrate;
a second transistor comprising an oxide semiconductor layer including indium in a second channel formation region, the second transistor being over the first transistor; and
a photodiode over the second transistor, the photodiode being electrically connected to the second transistor,
wherein one of a source electrode and a drain electrode of the second transistor is electrically connected to a gate electrode of the first transistor, and
wherein a gate electrode of the second transistor overlaps the gate electrode of the first transistor when seen from a direction perpendicular to a top surface of the semiconductor substrate.

2. The semiconductor device according to claim 1, wherein the photodiode overlaps the second transistor.

3. The semiconductor device according to claim 2, wherein the photodiode overlaps the first transistor.

4. The semiconductor device according to claim 1, wherein the first channel formation region comprises crystalline silicon.

5. The semiconductor device according to claim 4, wherein the first channel formation region is included in the semiconductor substrate.

6. The semiconductor device according to claim 1, wherein a semiconductor layer of the photodiode comprises crystalline silicon.

7. The semiconductor device according to claim 1, wherein the photodiode comprises a p-type semiconductor region, an i-type semiconductor region, and an n-type semiconductor region.

8. The semiconductor device according to claim 1, wherein an anode of the photodiode is electrically connected to the other of the source electrode and the drain electrode of the second transistor.

9. A semiconductor device comprising:
a semiconductor substrate;
a first transistor comprising a first channel formation region;
an interlayer insulating film over the first transistor and the semiconductor substrate;
an insulating film over the interlayer insulating film;
an opening in the interlayer insulating film and the insulating film;
a wiring in the opening, the wiring being electrically connected to a gate electrode of the first transistor,
a second transistor comprising an oxide semiconductor layer including indium in a second channel formation region, the second transistor being over the first transistor; and
a photodiode over the second transistor, the photodiode being electrically connected to the second transistor,
wherein one of a source electrode and a drain electrode of the second transistor is electrically connected to the wiring, and
wherein the photodiode overlaps a gate electrode of the second transistor when seen from a direction perpendicular to a top surface of the semiconductor substrate.

10. The semiconductor device according to claim 9, wherein the photodiode overlaps the second transistor.

11. The semiconductor device according to claim 10, wherein the photodiode overlaps the first transistor.

12. The semiconductor device according to claim 9, wherein the first channel formation region comprises crystalline silicon.

13. The semiconductor device according to claim 12, wherein the first channel formation region is included in the semiconductor substrate.

14. The semiconductor device according to claim 9, wherein a semiconductor layer of the photodiode comprises crystalline silicon.

15. The semiconductor device according to claim 9, wherein the photodiode comprises a p-type semiconductor region, an i-type semiconductor region, and an n-type semiconductor region.

16. The semiconductor device according to claim 9, wherein an anode of the photodiode is electrically connected to the other of the source electrode and the drain electrode of the second transistor.

17. The semiconductor device according to claim 9, further comprising:
a third transistor comprising an oxide semiconductor layer including indium in a third channel formation region over the semiconductor substrate,
wherein the photodiode overlaps a gate electrode of the third transistor when seen from the direction perpendicular to the top surface of the semiconductor substrate.

18. The semiconductor device according to claim 1, wherein the first transistor is provided in an amplifier circuit.

19. The semiconductor device according to claim 9, wherein the first transistor is provided in an amplifier circuit.

* * * * *